(12) United States Patent
Kim et al.

(10) Patent No.: US 8,071,994 B2
(45) Date of Patent: Dec. 6, 2011

(54) SEMICONDUCTOR LIGHT-EMITTING DEVICE WITH IMPROVED LIGHT EXTRACTION EFFICIENCY

(75) Inventors: Sun Woon Kim, Seoul (KR); Hyun Kyung Kim, Kyungki-do (KR); Je Won Kim, Kyungki-do (KR); In Seok Choi, Kyungki-do (KR); Kyu Han Lee, Kyungki-do (KR); Jeong Tak Oh, Kyungki-do (KR)

(73) Assignee: Samsung LED Co., Ltd., Suwon, Gyunggi-Do (KR)

( * ) Notice: Subject to any disclaimer, the term of this patent is extended or adjusted under 35 U.S.C. 154(b) by 10 days.

(21) Appl. No.: 12/624,106

(22) Filed: Nov. 23, 2009

(65) Prior Publication Data

US 2010/0065877 A1 Mar. 18, 2010

Related U.S. Application Data

(62) Division of application No. 11/098,802, filed on Apr. 5, 2005, now Pat. No. 7,692,201.

(30) Foreign Application Priority Data

Nov. 4, 2004 (KR) .................. 10-2004-0089313

(51) Int. Cl.
*H01L 33/00* (2010.01)
(52) U.S. Cl. ............. 257/98; 257/13; 257/E33.074
(58) Field of Classification Search .......... 257/13, 257/79, 98, E33.074; 438/29
See application file for complete search history.

(56) References Cited

U.S. PATENT DOCUMENTS

| | | | |
|---|---|---|---|
| 5,956,568 A | 9/1999 | Shiralagi et al. | |
| 6,111,266 A | 8/2000 | Carline et al. | |
| 6,316,785 B1 * | 11/2001 | Nunoue et al. | 257/14 |
| 6,388,275 B1 | 5/2002 | Kano | |
| 6,670,647 B1 | 12/2003 | Yamasaki et al. | |
| 6,781,160 B1 | 8/2004 | Tsai et al. | |
| 6,881,981 B2 * | 4/2005 | Tsuda et al. | 257/88 |
| 6,891,201 B2 * | 5/2005 | Tsuda et al. | 257/88 |
| 7,042,150 B2 * | 5/2006 | Yasuda | 313/498 |
| 7,170,101 B2 | 1/2007 | Tatsumi et al. | |
| 2002/0000558 A1 * | 1/2002 | Morimoto | 257/79 |
| 2003/0057444 A1 | 3/2003 | Niki et al. | |
| 2004/0113163 A1 | 6/2004 | Steigerwald et al. | |
| 2004/0113166 A1 * | 6/2004 | Tadatomo et al. | 257/98 |
| 2005/0017258 A1 | 1/2005 | Fehrer et al. | |
| 2005/0205885 A1 * | 9/2005 | Nakagawa et al. | 257/98 |
| 2005/0218416 A1 * | 10/2005 | Cho et al. | 257/98 |
| 2005/0227379 A1 | 10/2005 | Donofrio | |
| 2006/0169987 A1 * | 8/2006 | Miura et al. | 257/79 |

FOREIGN PATENT DOCUMENTS

WO 03030271 A2 4/2003

* cited by examiner

*Primary Examiner* — Allan R Wilson
(74) *Attorney, Agent, or Firm* — Volpe and Koenig, P.C.

(57) ABSTRACT

The present invention provides a semiconductor light-emitting device. The light-emitting device comprises a first conductive clad layer, an active layer, and a second conductive clad layer sequentially formed on a substrate. In the light-emitting device, the substrate has one or more side patterns formed on an upper surface thereof while being joined to one or more edges of the upper surface. The side patterns consist of protrusions or depressions so as to scatter or diffract light to an upper portion or a lower portion of the light-emitting device.

11 Claims, 6 Drawing Sheets

SEMICONDUCTOR LIGHT-EMITTING DEVICE WITH IMPROVED LIGHT EXTRACTION EFFICIENCY

CROSS REFERENCE TO RELATED APPLICATIONS

This application is a division of U.S. patent application Ser. No. 11/098,802, filed Apr. 5, 2005, the entire contents of which are incorporated by reference as if fully set forth.

This application is based upon and claims the benefit of priority from prior Korean Patent Application No. 10-2004-0089313 filed Nov. 4, 2004, the entire contents of which are incorporated herein by reference.

FIELD OF INVENTION

The present invention relates to a semiconductor light-emitting device, and more particularly, to a semiconductor light-emitting device, designed to have a pattern on an upper surface of a substrate in order to improve light extraction efficiency thereof.

BACKGROUND

Generally, a semiconductor light-emitting device comprises a first conductive clad layer, an active layer, and a second conductive clad layer sequentially formed on a substrate. When a voltage is applied to the light-emitting device through electrodes connected to the first and second conductive clad layers, respectively, the semiconductor light-emitting device allows electrons and holes to be recombined in the active layer thereof, and thus generates light within a specific frequency range.

Light-emitting efficiency of the semiconductor light-emitting device depends on internal quantum efficiency and light extraction efficiency (which can also be referred to as external quantum efficiency). Particularly, the light extraction efficiency depends on optical factors, that is, the refractivity of respective layer structures and/or the flatness of an interface between the layers.

In view of light extraction efficiency, the semiconductor light-emitting device has fundamental limitations. That is, larger refractivity of the semiconductor layers constituting the semiconductor light-emitting device compared with the atmosphere or the substrate decreases a critical angle, which determines an incident angle of light to be emitted, and results in the total internal reflection of significant amounts of light generated from the active layer, whereby the light travels substantially in a lateral direction, causing a significant amount of the light to be lost inside the light-emitting device or to be emitted in the undesired lateral direction.

For instance, in a nitride semiconductor light-emitting device, since GaN has a refractivity of 2.4, an incident angle larger than 23.6 degree., that is, a critical angle at the GaN/atmosphere interface, results in the total internal reflection of the light generated from the active layer, thereby forcing the light to travel within the light-emitting device in the lateral direction, so that the light is lost inside the light-emitting device or emitted in the undesired lateral direction. Accordingly, the light extraction efficiency is merely 6% at the GaN/atmosphere interface. Moreover, since a sapphire substrate has a refractivity of 1.78 similar to that of the GaN layer, the light extraction efficiency is merely 13% at a GaN/sapphire substrate interface.

In order to solve such a problem, US Patent Publication No. 2003-57444 (Publication date: Mar. 27, 2003, Assignee: Nichia Corporation) discloses a semiconductor light-emitting device in which an irregular portion 13 comprising protrusions or depressions is formed on a substrate 11 of the light-emitting device, as shown in FIG. 1a. According to the disclosure, the irregular portion 13 on the substrate 11 can substantially increase an incident angle of a GaN/sapphire substrate interface, thereby enhancing the light extraction efficiency of the GaN/sapphire substrate interface.

The above-mentioned semiconductor light-emitting device can enhance the light-emitting efficiency of the device to a certain level (light-emitting efficiency enhanced about 20%) by enhancing the light extraction efficiency through the irregular portion on the substrate. However, in view of a chip scale light-emitting device, since there is no consideration of an appropriate position of the irregular portion, the semiconductor light-emitting device of the disclosure cannot completely overcome the problem of optical loss due to the light emitted through side surfaces of the device. More specifically, the disclosure did not suggest a solution for extracting the light, which is generated from an active region of side surfaces of the device or reaches the side surfaces through total internal reflection, in a desired direction.

Referring to FIG. 1b, the construction of the chip scale light-emitting device is schematically illustrated which has the irregular portion 13 of FIG. 1a on the substrate 11. The chip scale light-emitting diode has a first conductive clad layer 14, an active layer 15, and a second conductive clad layer 16 sequentially formed on the substrate 11. As shown in FIG. 1b, since the irregular portion 13 is not formed on the side surfaces of the substrate 11, that is, along edges of an upper surface of the substrate 11, a significant amount of light, which is generated from the active region of the side surfaces of the device or reaches the side surfaces through the total internal reflection, is lost or cannot be extracted from the device in the vertical direction. As a result, the above described semiconductor light-emitting device has limitation in enhancing the light extraction efficiency.

As such, what is needed is to provide a technology for enhancing the light extraction efficiency in view of the chip scale light-emitting device, in order to improve the light-emitting efficiency thereof.

SUMMARY

The present invention has been made to solve the above problems, and it is an object of the present invention to provide a semiconductor light-emitting device, designed to enable light, which is generated from side surfaces of the light-emitting device or reaches the side surfaces through the total internal reflection of light, to be effectively emitted to an upper portion or a lower portion of the light emitting device, thereby enhancing the light extraction efficiency of the light-emitting device in view of a chip scale light-emitting device.

In accordance with one aspect of the present invention, the above and other objects can be accomplished by the provision of a semiconductor light-emitting device, comprising a first conductive clad layer, an active layer, and a second conductive clad layer sequentially formed on a substrate, wherein the substrate has one or more side patterns formed on an upper surface thereof while being joined to at least one edge of the upper surface, the side patterns consisting of protrusions or depressions so as to scatter or diffract light, emitted from side surfaces of the light-emitting device, to an upper portion or a lower portion of the light-emitting device.

The substrate may have a plurality of side patterns formed along the respective edges of the upper surface of the substrate. Preferably, the substrate has a rectangular-shaped upper surface, and the side patterns are extended along the at least one edge of the upper surface of the substrate from one corner of the upper surface to the other corner of the upper surface. More preferably, the substrate has a rectangular-shaped upper surface, and the side patterns are formed along two edges of the upper surface adjacent to a bonding electrode formed on the second conductive clad layer, or extended along four edges of the upper surface of the substrate.

The side patterns may consist of protrusions each having a surface slanted inwardly on the upper surface of the substrate, depressions each having a surface slanted outwardly on the upper surface of the substrate, or a combination thereof. When the side patterns consist of the combination of the protrusions and the depressions, the protrusions may be formed along one edge of the upper surface, and the depressions may be formed along the other edge thereof.

The side patterns may consist of protrusions or depressions having an upper surface or a lower surface having the same crystal plane as that of the upper surface of the substrate.

The substrate may be formed with one or more additional internal patterns inside the edges of the upper surface on the substrate. The internal patterns consist of protrusions or depressions to scatter or diffract light generated from the active layer.

The present invention may be advantageously employed for a nitride semiconductor light-emitting device, in which the first and second conductive clad layers, and the active layer are nitride semiconductor layers. The substrate may be an SiC substrate, Si substrate or GaAs substrate, but is not limited to these substrates.

BRIEF DESCRIPTION OF THE DRAWINGS

The foregoing and other objects and features of the present invention will be more clearly understood from the following detailed description taken in conjunction with the accompanying drawings, in which.

DETAILED DESCRIPTION OF THE PREFERRED EMBODIMENTS

Preferred embodiments will now be described in detail with reference to the accompanying drawings.

Figure 2A:
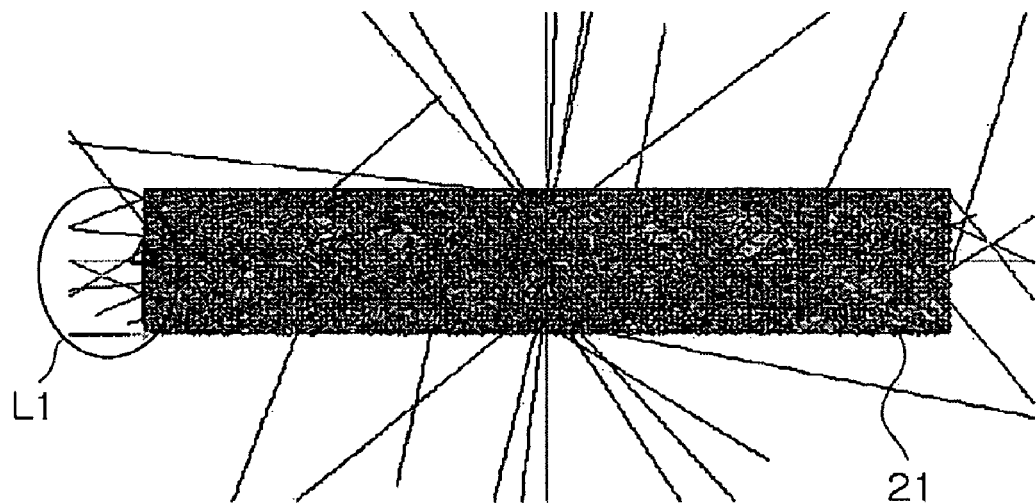
FIGS. 2a and 2b show light extraction paths in high refractivity layers, respectively, in order to illustrate a principle for improving light extraction efficiency, which can be applied to the present invention.
Figure 2B:
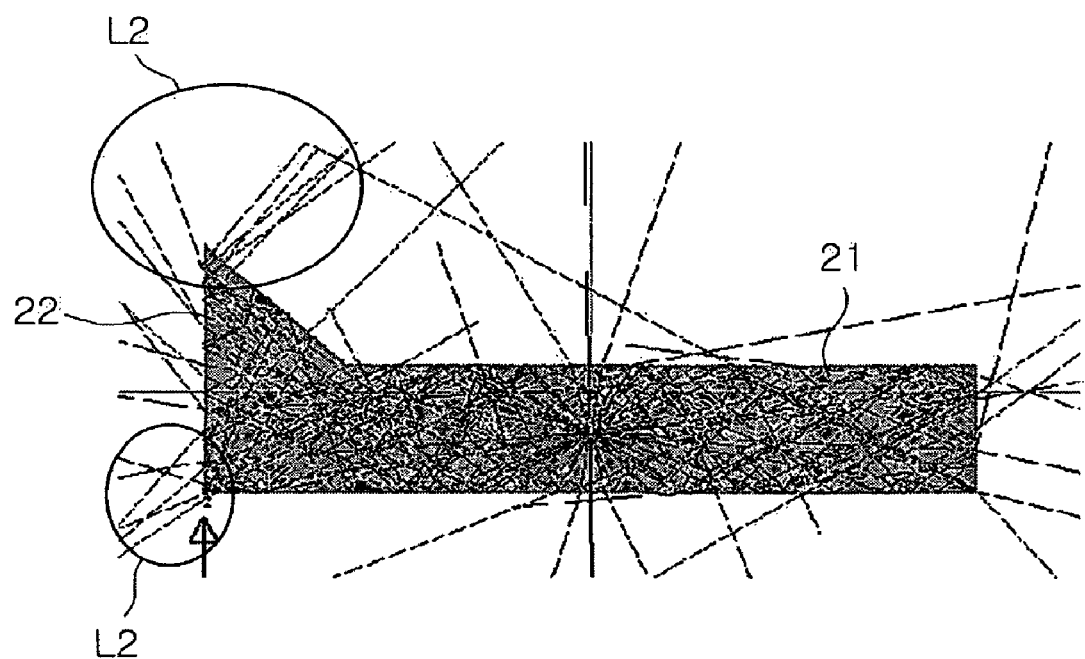

FIGS. 2a and 2b are simulation graphs illustrating light extraction paths in high refraction layers, respectively, in order to illustrate a principle for improving a light extraction efficiency, which can be applied to the present invention.

Here, it can be understood that high refractivity layers 21 shown in FIGS. 2a and 2b are semiconductor layers, each comprising an active layer of a semiconductor light-emitting device, and that a raised portion 22 of one side surface of the layers shown in FIGS. 2a and 2b corresponds to a side pattern (depressed shapes) of a substrate.

In the simulation of FIGS. 2a and 2b, assuming that the number of light beams is one thousand in total, 747 light beams are emitted from the light-emitting device in FIG. 2a, whereas 891 light beams are emitted from the light-emitting device in FIG. 2b, whereby it can be confirmed that the light extraction efficiency is enhanced about 19%. With regard to this, when considering that the raised portion is formed only on one side surface of the layer in FIG. 2b, it can be appreciated that the light extraction efficiency is remarkably enhanced.

Additionally, it can be confirmed that the raised portion of the side surface provides advantageous effects of not only increasing the amount of light extracted to the outside of the light-emitting device, but also allowing the light traveling in a lateral direction to be emitted through an upper surface or a lower surface of the device, which is a desired light-emitting surface. That is, as shown in FIG. 2a, when light is generated within the high refractivity layer 21 having a flat surface, a significant amount L1 of the light is emitted in the lateral direction as described previously. On the contrary, as shown in FIG. 2b, when the raised portion 22 is formed on one side surface of the high refractivity layer 21, a significant amount L2 of the light traveling in the lateral direction is oriented in the vertical direction unlike FIG. 2a, thereby remarkably enhancing the effective light extraction efficiency.

Unlike the technology for forming the irregular portion on the substrate in a conventional wafer scale, a technology for enhancing the light extraction efficiency of the invention applies the principle illustrated in FIGS. 2a and 2b, and effectively controls the light emitted in the lateral direction in a chip scale semiconductor light-emitting device, thereby remarkably enhancing the light extraction efficiency.

The present invention provides one or more side patterns formed on an upper surface of a substrate while being joined to one or more side surfaces of the substrate in a chip scale semiconductor light-emitting device, in order to scatter or diffract light, which is emitted in the lateral direction, to an upper portion or a lower portion of the light-emitting device.

The side patterns of the invention may consist of one or more protrusions or depressions, which are formed on the upper surface of a substrate while being joined to the one or more side surfaces of the substrate in a unit chip. Preferably, the side patterns consist of one or more protrusions or depressions, which are extended from one or more corners to the other corners on the upper surface of the substrate.

Figure 3A:
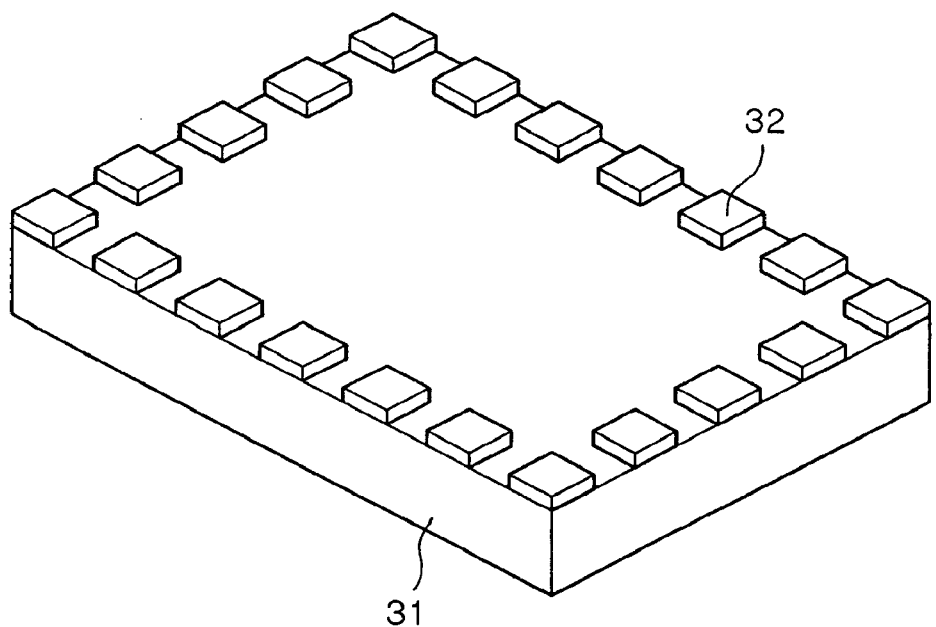
FIGS. 3a and 3b show a substrate having side patterns, and a chip scale semiconductor light-emitting device using the same in accordance with one embodiment of the present invention, respectively.
Figure 3B:
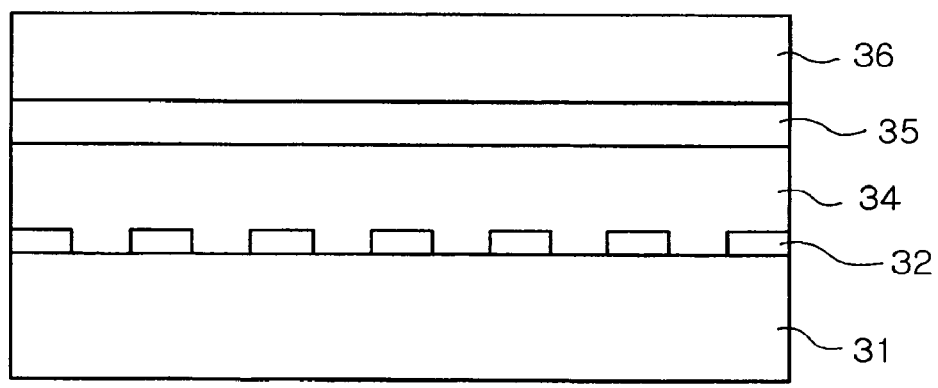

FIGS. 3a and 3b show a substrate having side patterns, and a chip scale semiconductor light-emitting device using the same in accordance with one embodiment of the invention, respectively.

Referring to FIG. 3a, a substrate 31 used for the chip scale semiconductor light-emitting device is illustrated. A plurality of protrusion-shaped side patterns 32 is continued along four edges of an upper surface of the substrate 31. The side patterns 32 are disposed on the substrate 31 such that each of the side patterns 32 is joined to a side surface of the substrate 31, thereby scattering or refracting light emitted in the lateral direction.

FIG. 3b is a cross-sectional view illustrating a chip scale semiconductor light-emitting device manufactured using the substrate 31 having the side patterns 32 thereon shown in FIG. 3a. Referring to FIG. 3b, the semiconductor light-emitting device comprises a first conductive clad layer 34, an active layer 35, and a second conductive clad layer 36 sequentially formed on the substrate 31.

Figure 1A:
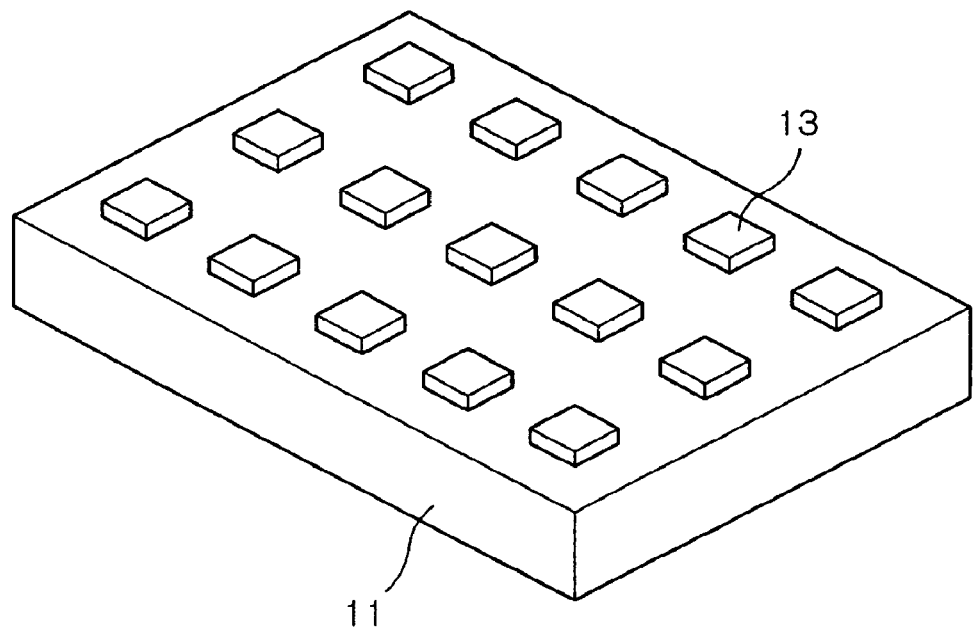
FIGS. 1a and 1b show a conventional substrate having an irregular portion, and a chip scale semiconductor light-emitting device using the same.
Figure 1B:
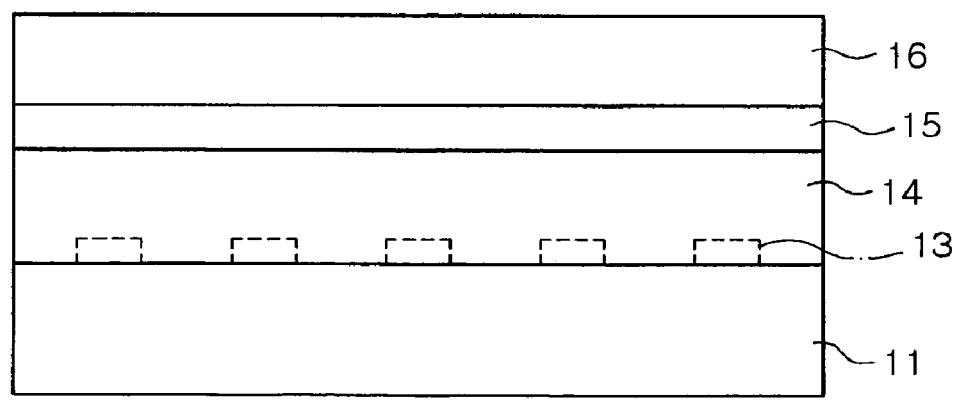

Unlike the semiconductor light-emitting device shown in FIG. 1b, the semiconductor light-emitting device shown in FIG. 3b has the plurality of side patterns 32 exposed along side surfaces of the device. The side patterns 32 formed along the side surfaces of the device allow light, which is generated from the side surfaces of an active region of the device or emitted from the side surfaces of the device due to the total internal reflection of light, to be scattered or refracted in the vertical direction, thereby guiding the light towards an upper portion or a lower portion of the light-emitting device.

According to the present invention, the substrate may have a rectangular-shaped upper surface, and the side patterns may be continued from at least one corner to the other corner. More preferably, when the substrate has the rectangular-shaped upper surface, the side patterns are continued along four edges of the substrate.

Figure 4A:
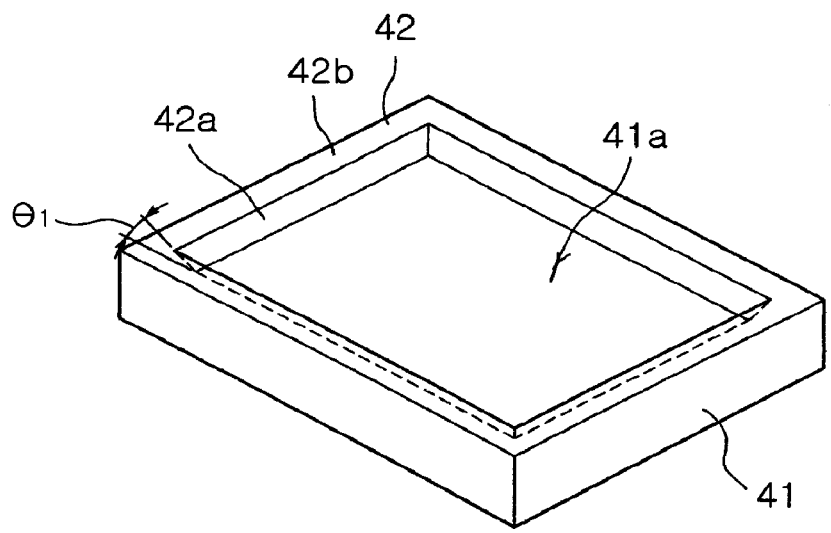
FIGS. 4a to 4c are perspective views illustrating substrates in accordance with preferred embodiments of the present invention.
Figure 4B:
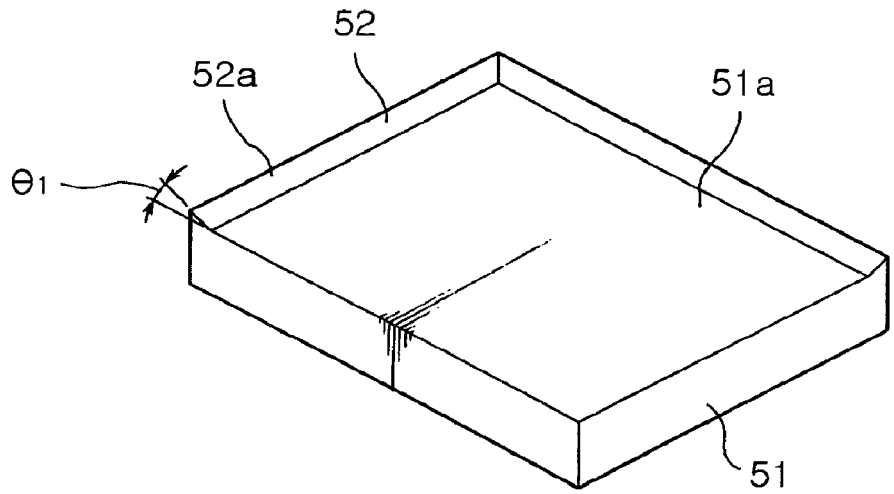
Figure 4C:
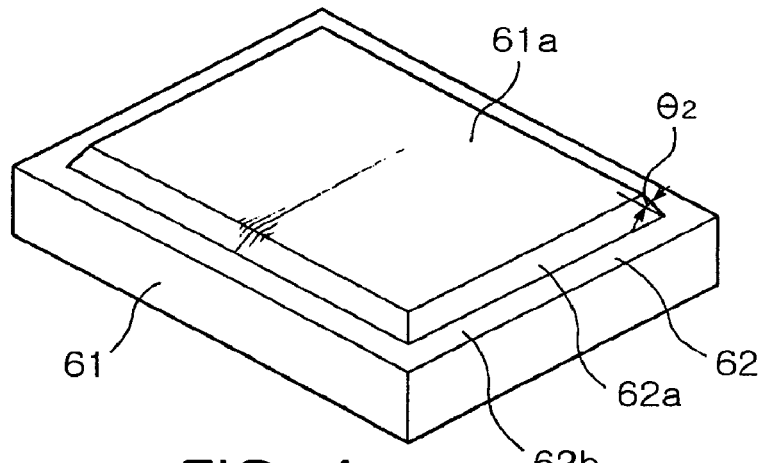

Various shapes of substrate applicable to the invention are exemplified in FIGS. 4a to 4c.

Referring to FIG. 4a, a substrate 41 is illustrated which has a substantially rectangular-shaped upper surface 41a. The upper surface 41a of the substrate is formed with side patterns 42 continued along four edges of the upper surface 41a. The side patterns 42 have a surface 42a slanted inwardly at a predetermined angle 91 on the upper surface 41a of the substrate 41, and an upper surface 42b having the same crystal plane as that of the upper surface 41a of the substrate. The side patterns 42 may be achieved through a selective etching process generally used in the art, and the slant surface 42a may be prepared with a specific crystal plane of a material constituting the substrate 41 through the etching process for forming the side patterns, whereby the angle of the slant surface 42a may be determined. It is desirable that the crystal plane of the slant surface 42a be selected to allow the semiconductor layers constituting the light-emitting device to be appropriately grown.

The substrate may be a sapphire substrate or a SiC substrate, which is mainly used for a nitride semiconductor light-emitting device. Alternatively, the substrate may be a typical Si or GaAs substrate. However, the substrate of the invention is not limited to these.

Unlike the side patterns shown in FIG. 4a, according to another embodiment of the invention, the side patterns may be formed at one edge of the upper surface of the substrate, and be changed in the shape thereof. Referring to FIG. 4b, a substrate 51 is illustrated which has a substantially rectangular-shaped upper surface 51a.

The upper surface 51a of the substrate 51 is formed with side patterns 52 continued along two edges of the upper surface 51a. The two edges of the upper surface 51a, at which the side patterns 52 are formed, may be adjacent to a bonding electrode (not shown) formed on an uppermost semiconductor layer (mainly, a p-type semiconductor layer). Since a main light-emitting portion is formed at a portion adjacent to the bonding electrode in the light-emitting device, even if the side patterns 52 are formed along only two edges of the upper surface 51a adjacent to the bonding electrode, the light extraction efficiency of the light-emitting device can be remarkably enhanced. Moreover, the side patterns 52 may have only a surface 52a slanted inwardly at a predetermined angle .theta.1 on the upper surface 51a of the substrate 51.

Although the side patterns 42 and 52 are prepared as the protrusions in the embodiments shown in FIGS. 4a and 4b, side patterns 62 may be realized as depressions according to still another embodiment of the invention.

Referring to FIG. 4c, a substrate 61 is illustrated which has a substantially rectangular-shaped upper surface 61a. The upper surface 61a of the substrate is formed with side patterns 62 continued along four edges of the upper surface 61a. Unlike the side patterns shown in FIGS. 4a and 4b, the side patterns 62 are prepared as depressions. The side patterns 62 have a surface 62a slanted outwardly at a predetermined angle 92 on the upper surface 61a of the substrate 61, and a bottom surface 62b having the same crystal plane as that of the upper surface 61a of the substrate. As previously described, the slant surface 62a may be prepared to have a specific crystal plane of a material constituting the substrate 61 through the etching process for forming the side patterns, whereby the angle of the slant surface 62a can be determined. Additionally, the upper surface 62b of the side patterns 62 according to this embodiment, and the upper surface 42b of the side patterns 42 shown in FIG. 4a serve to provide a process margin, when forming the side patterns 42 and 62 through the etching process in a wafer leveling process. This will be described in detail with reference to FIGS. 6a to 6d.

Figure 5A:
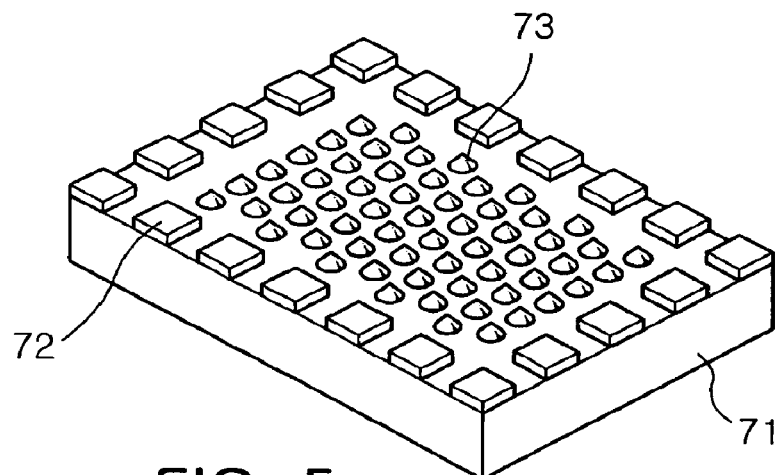
FIGS. 5a to 5c are perspective views illustrating substrates in accordance with other preferred embodiments of the present invention.
Figure 5B:
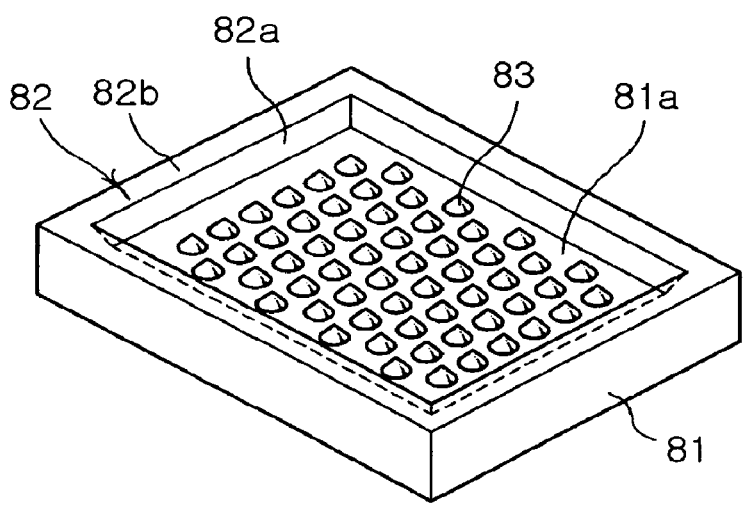
Figure 5C:
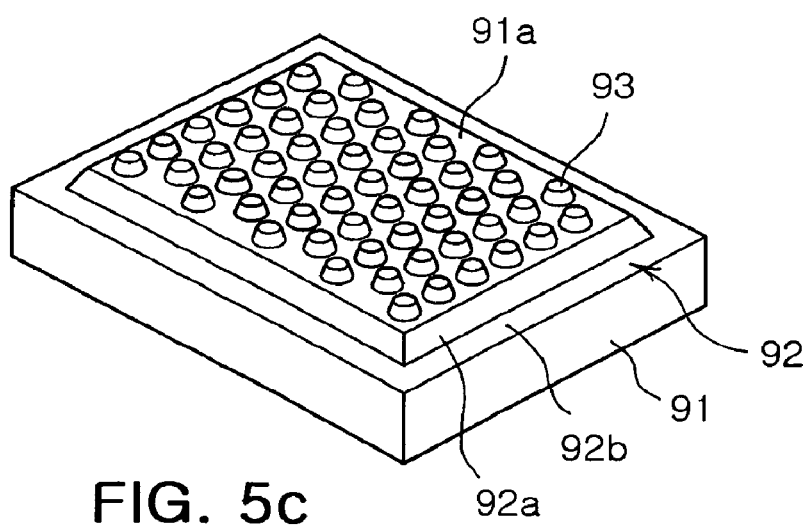

When the side patterns of the present invention are coupled to an internal pattern similar to the conventional irregular portion, it can be desired to provide significantly enhanced light extraction efficiency. FIGS. 5a to 5c illustrate exemplary substrate having both side patterns and conventional internal patterns.

Referring to FIG. 5a, a substrate 71 is illustrated which has a plurality of conical internal patterns 73 on the substrate 71 together with side patterns 72 similar to the side patterns shown in FIG. 3a. The side patterns 72 consist of a plurality of protrusions continued along four edges of the upper surface of the substrate 71, and the conical internal patterns 73 are uniformly spaced a predetermined distance from each other on the substrate 71. The internal patterns additionally enhance the light extraction efficiency in an interior region of the device, thereby remarkably enhancing the light-emitting efficiency of the device.

Referring to FIG. 5b, a substrate 81 is illustrated which has a plurality of conical internal patterns 83 on the substrate together with side patterns 82 similar to the side patterns 42 shown in FIG. 4a. The side patterns 82 have a surface 82a slanted inwardly on the upper surface 81a of the substrate 81, and an upper surface 82b having the same crystal plane as that of the upper surface 81a of the substrate 81. The conical internal patterns 73 are uniformly spaced a predetermined distance from each other.

Referring to FIG. 5c, a substrate 91 is illustrated which has a plurality of mesa-shaped internal patterns 93 on the substrate together with side patterns 92 similar to the side patterns 62 shown in FIG. 4c. The side patterns 92 have a surface 92a slanted outwardly on the upper surface 91a of the substrate 91, and an upper surface 92b having the same crystal plane as that of the upper surface 91a of the substrate 91. The mesa-shaped internal patterns 93 are uniformly spaced a predetermined distance from each other.

Although the internal patterns 73, 83 and 93 according to the various embodiments are exemplified to have the conical shapes or the mesa shape, the internal patterns may be prepared to have protrusions or depressions of various shapes. For instance, instead of a circular-shaped cross section, each of the internal patterns may have a polygonal-shaped cross section, such as a triangular cross section or a rectangular cross section in a top view, and may have a rectangular cross section or a trapezoid-shaped cross section in a side view.

However, the present invention is not limited to these shapes, and the internal patterns may be arranged in various arrangements.

Figure 6A:
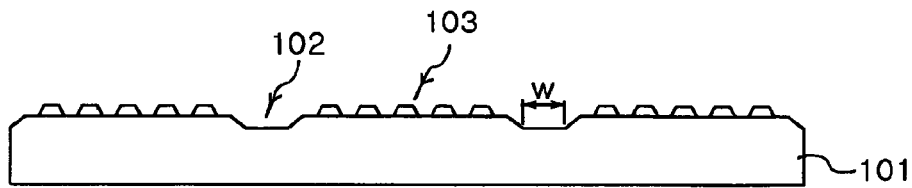
FIGS. 6a to 6d are flow diagrams illustrating a method of manufacturing a semiconductor light-emitting device in accordance with one preferred embodiment of the present invention.
Figure 6B:
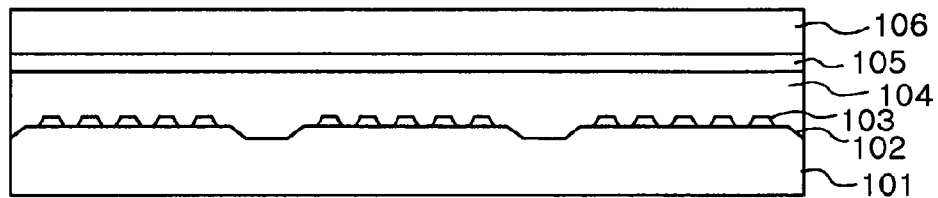

FIGS. 6a to 6d are flow diagrams illustrating a method of manufacturing a semiconductor light-emitting device in accordance with one preferred embodiment of the present invention. The process illustrated in the drawings is the wafer leveling process for manufacturing the light-emitting device shown in FIG. 5c, and thus, it can be understood that the substrate shown in FIG. 6a is some portion of a wafer.

First, as shown in FIG. 6a, a plurality of side patterns 102 and internal patterns 103 are formed on a substrate 101 for a light-emitting device (meanwhile, for clarity of description, the patterns are divided into three sections in FIG. 6a). Here, the internal patterns have a trapezoid-shaped cross section in a side view, as an example. The side patterns 102 and internal patterns 103 may be formed through separate etching processes. For instance, after forming a first mask opened at a plurality of regions through an upper surface of the first mask, the internal patterns 103 are formed through a primary etching process. Then, after a second mask is formed with its side surfaces opened, the side patterns 102 are formed through a secondary etching process. The side patterns 102 are formed to connect to a substrate region for a next light-emitting device. The width W between the bottom surfaces of two adjacent lateral patterns 103 prepares for an error upon cutting, thereby providing an opportunity for stably form the side patterns each having a slanted surface on both substrates.

Next, as shown in FIG. 5b, a first conductive clad layer 104, an active layer 105, and a second conductive clad layer 106 are sequentially formed on the substrate 101 having the side patterns 102 and the internal patterns 103 thereon. Although the plane, on which the first conductive clad layer 104 is grown, has a predetermined pattern, it can have a desired crystallinity through an appropriate lateral growth by controlling growth conditions such as growth rate, pressure, and the like.

Figure 6C:
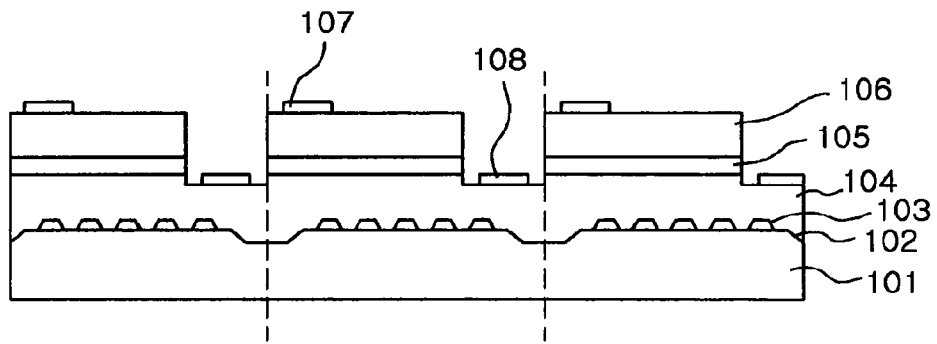
Figure 6D:
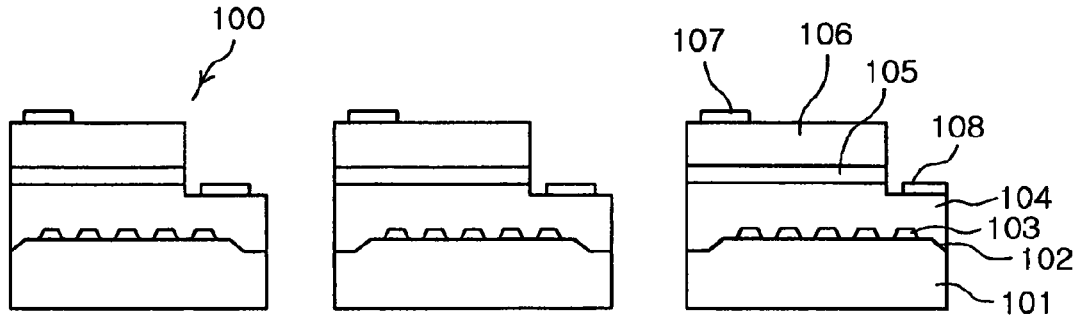

Next, mesa etching is performed thereon as shown in FIG. 6c, such that some portion of the first conductive clad layer 104 can be exposed in the respective sections of the device, and then first and second electrodes 107 and 108 are formed on upper surfaces of the second clad layer 106 and on exposed upper surfaces of the first conductive clad layer 104, respectively.

Finally, as indicated by the dotted line in FIG. 5c, a cutting process is performed thereon, thereby separating the light-emitting device into separate chip scale light-emitting devices 100. Each of the light-emitting devices 100 shown in FIG. 6c has side patterns 102 consisting of depressions formed along respective edges of an upper surface of the substrate, and internal patterns 103 consisting of protrusions formed inside the edges of the upper surface of the substrate.

As previously described, the internal patterns 103 can enhance the light extraction efficiency by reducing the light subjected to the total internal reflection by adjusting a critical angle of light. Additionally, as described in FIG. 2b, the side patterns 102 enhance the light extraction efficiency at the active layer 105, and at the same time, force the light emitted in the lateral direction of the device to travel in the vertical direction (in a flip-chip construction) as much as possible, thereby remarkably enhancing effective light-emitting efficiency.

The present invention is not limited to the nitride semiconductor light-emitting device, and may be applied to AlGaAs or AlGaInP semiconductor light-emitting devices.

As apparent from the above description, according to the present invention, as the one or more side patterns are formed along the respective edges of the upper surface of the substrate, which is used for the chip scale semiconductor light-emitting device, the semiconductor light-emitting device of the invention can force the light, which is generated from side surfaces of the light-emitting device or reaches the side surfaces, to be scattered or refracted to the upper portion or the lower portion of the light emitting device, while forcing the light subjected to the total internal reflection in the side surfaces of the light emitting device to be effectively extracted from the light emitting device, thereby remarkably enhancing the light extraction efficiency of the semiconductor light-emitting device.

It should be understood that the embodiments and the accompanying drawings as described above have been described for illustrative purposes and the present invention is limited by the following claims. Further, those skilled in the art will appreciate that various modifications, additions and substitutions are allowed without departing from the scope and spirit of the invention as set forth in the accompanying claims.

What is claimed is:

1. A semiconductor light-emitting device, comprising:
a substrate used in growing a semiconductor crystal;
a first conductive clad layer, an active layer, and a second conductive clad layer sequentially grown on an upper surface of the substrate, covering an entire area between opposing side surfaces of the substrate,
wherein the substrate has side patterns formed along all edges of the upper surface of the substrate and a plurality of internal patterns, and the side patterns and the internal patterns are differently shaped.

2. The light-emitting device as set forth in claim 1, wherein the side patterns comprise discontinuously formed protrusions.

3. The light-emitting device as set forth in claim 2, wherein each of the internal patterns is a discontinuously formed convex or concave pattern formed on the upper surface of the substrate.

4. The light-emitting device as set forth in claim 3, wherein the protrusions have an upper surface having the same crystal plane as that of the upper surface of the substrate.

5. The light-emitting device as set forth in claim 3, wherein the side patterns are bigger than the internal patterns.

6. The light-emitting device as set forth in claim 1, wherein the side patterns comprise continuously formed protrusions or depressions.

7. The light-emitting device as set forth in claim 6, wherein each of the internal patterns is a discontinuously formed convex or concave pattern formed on the upper surface of the substrate.

8. The light-emitting device as set forth in claim 7, wherein the side patterns comprise protrusions each having a surface slanted inwardly on the upper surface of the substrate.

9. The light-emitting device as set forth in claim 8, wherein the protrusions have an upper surface comprising the same crystal plane as that of the upper surface of the substrate.

10. The light-emitting device as set forth in claim 6, wherein the side patterns comprise the depressions having a surface slanted outwardly on the upper surface of the substrate.

11. The light-emitting device as set forth in claim 10, wherein the depressions have an upper surface having the same crystal plane as that of the upper surface of the substrate.

* * * * *